(12) United States Patent
Takeuchi

(10) Patent No.: US 9,251,914 B1
(45) Date of Patent: Feb. 2, 2016

(54) TEST CONTROL CIRCUIT, SEMICONDUCTOR MEMORY DEVICE AND METHOD FOR TESTING THE SAME

(71) Applicant: Spansion LLC, Sunnyvale, CA (US)

(72) Inventor: Chihiro Takeuchi, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/472,043

(22) Filed: Aug. 28, 2014

(51) Int. Cl.
   *G11C 7/00* (2006.01)
   *G11C 29/04* (2006.01)
   *G11C 8/04* (2006.01)

(52) U.S. Cl.
   CPC . *G11C 29/04* (2013.01); *G11C 8/04* (2013.01)

(58) Field of Classification Search
   USPC .......................................... 365/201, 185.29
   See application file for complete search history.

(56) References Cited

U.S. PATENT DOCUMENTS

| | | | | |
|---|---|---|---|---|
| 7,116,592 B2 * | 10/2006 | Takeda | ................... | G11C 29/44 365/189.06 |
| 2012/0051138 A1 * | 3/2012 | Kim | ................... | G11C 16/0483 365/185.17 |

* cited by examiner

*Primary Examiner* — Anthan Tran

(57) ABSTRACT

Disclosed herein are test control circuit, semiconductor memory device, and testing method embodiments for suppressing variations in test time while reducing the influence of a failed cell. An embodiment operates by performing a first verify of a cell selected in a predetermined order; storing an address of the cell when the first verify is a fail until the number of addresses is a predetermined number; applying a predetermined voltage to a plurality of cells of an erase unit when a next fail is determined in the first verify after the predetermined number of addresses have been stored; and performing a second verify to one or more cells indicated by the predetermined number of addresses, wherein the first verify is performed from a cell at the next fail according to the predetermined order after the second verify has finished.

5 Claims, 16 Drawing Sheets

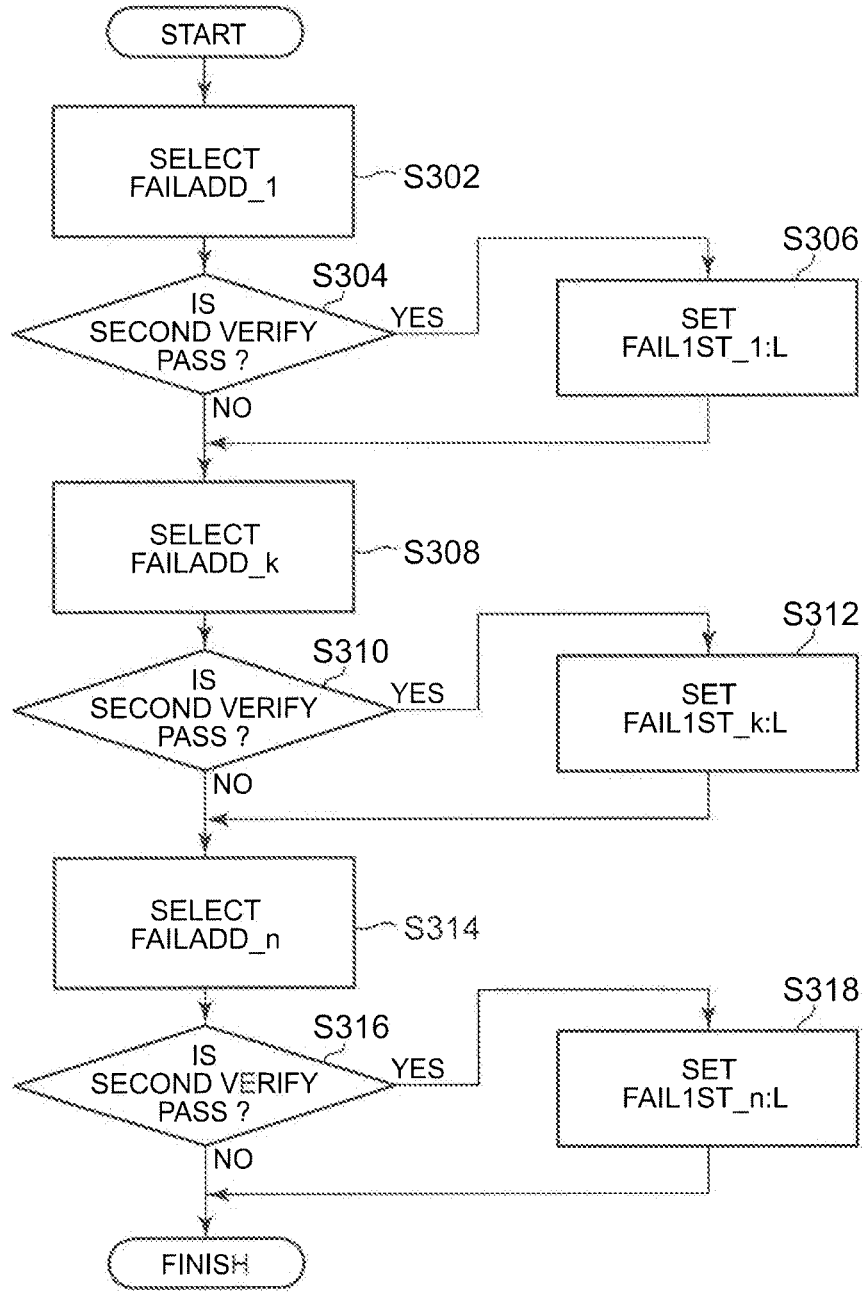

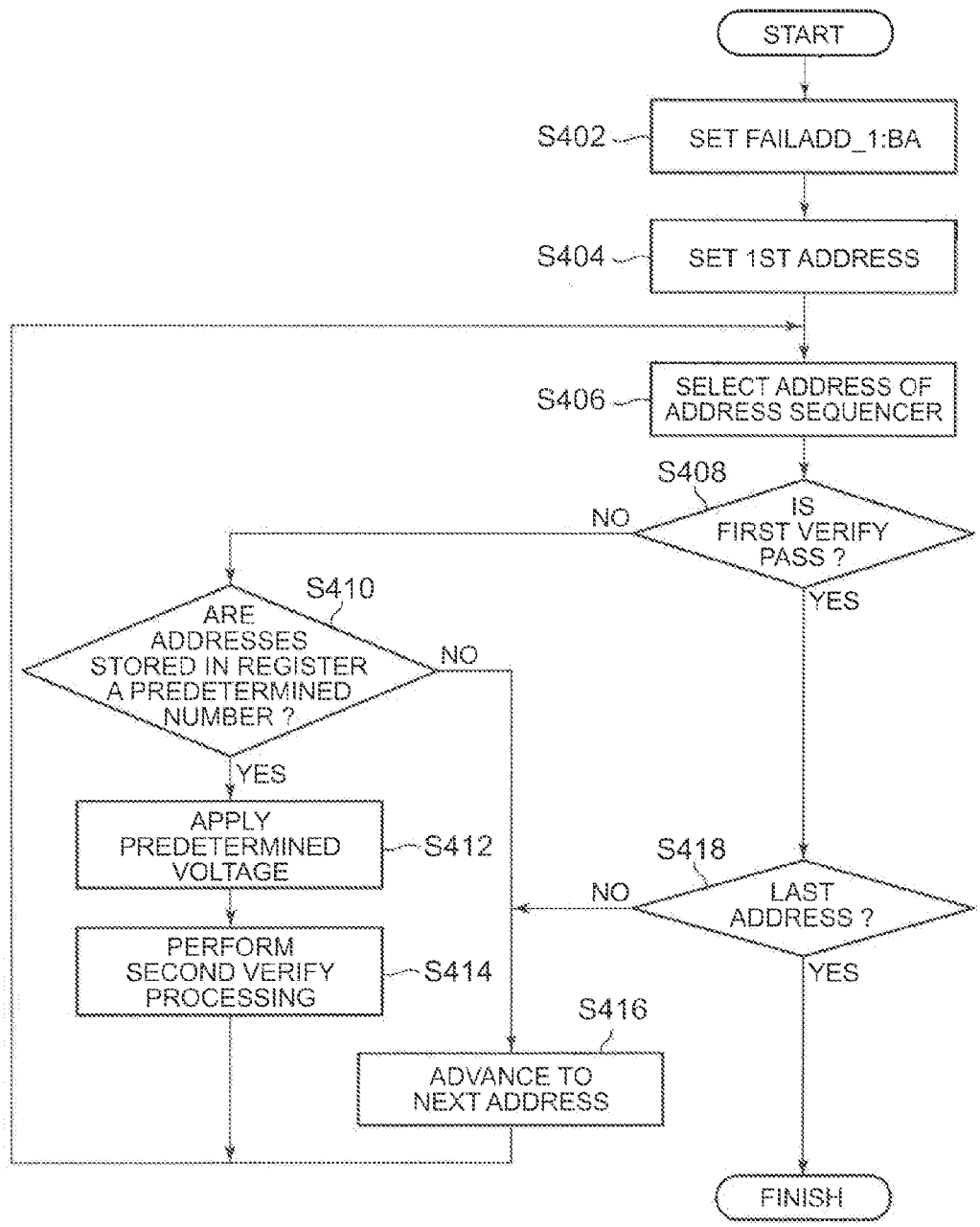

TEST CONTROL CIRCUIT, SEMICONDUCTOR MEMORY DEVICE AND METHOD FOR TESTING THE SAME

BACKGROUND

An erase test is generally performed in an erase unit, e.g., a sector unit in an erase test for a semiconductor memory device. For example, an erase pulse may be impressed to a memory cell group divided into a plurality of groups until a group determined to have been subjected to the completion of erasure appears in performing a first erase test. Next, a second erase test may be performed on the memory cell group on the basis of the number of erase pulses at the detection of each group determined as having been subjected to the completion of erasure (as in, for example, Japanese Unexamined Patent Application Publication No. 2013-1378445).

However, when performing the erase test with division into the plurality of groups, the address of a firstly failed cell is stored, and a predetermined voltage for erasure is applied only when a fail has been determined as to each cell in the plural groups. In an address sequencer, the erase test is performed again in an overlapping form after having returned to the stored address. That is, the erase test is continued without application of the predetermined voltage, even if the fail has been determined with respect to the cell in one group is failed, and it is possible to reduce the influence of the failed cell. In the address sequencer, however, the erase test is performed again after having returned to the stored address, and therefore a loop of addresses has occurred and dispersion has arisen at testing time.

SUMMARY

Provided herein are test control circuit, semiconductor memory device, and testing method embodiments, and/or combinations and sub-combinations thereof, which are capable of suppressing variations in test time while reducing the influence of a failed cell.

An embodiment includes a test control circuit comprising an address sequencer that generates a first address for selecting a cell in a predetermined order; a register that stores a second address of a cell that is determined to be a fail by a verify determination; a selector that selects the first address generated by the address sequencer or the second address stored in the register based on whether or not one or more predetermined number of addresses have been stored in the register; and a verify determination circuit that performs a verify determination of a cell which is indicated by the address selected by the selector; wherein the verify determination circuit performs a first verify determination of a cell which is indicated by the first address generated by the address sequencer and performs a second verify determination of one or more cells which are indicated by the one or more predetermined number of addresses after a predetermined voltage has been applied to a plurality cells of an erase unit where there is a cell determined to be a fail in the first verify determination in a state in which the one or more predetermined number of addresses have been stored in a register, and wherein the selector selects the first address generated by the address sequencer after the second verify determination has been finished.

Another embodiment includes a semiconductor memory device comprising a test control circuit comprising an address sequencer that generates a first address for selecting a cell in a predetermined order; a register that stores a second address of a cell that is determined to be a fail by a verify determination; a selector that selects the first address generated by the address sequencer or the second address stored in the register based on whether or not one or more predetermined number of addresses have been stored in the register; and a verify determination circuit that performs a verify determination of a cell which is indicated by the address selected by the selector; wherein the verify determination circuit performs a first verify determination of a cell which is indicated by the first address generated by the address sequencer and performs a second verify determination of one or more cells which are indicated by the one or more predetermined number of addresses after a predetermined voltage has been applied to a plurality cells of an erase unit where there is a cell determined to be a fail in the first verify determination in a state in which the one or more predetermined number of addresses have been stored in a register, and wherein the selector selects the first address generated by the address sequencer after the second verify determination has been finished; and a memory cell array including the cell.

A further embodiment includes a testing method comprising performing a first verify of a cell selected in a predetermined order; storing an address of the cell when the first verify is a fail until the number of addresses is a predetermined number; applying a predetermined voltage to a plurality of cells of an erase unit when a next fail is determined in the first verify after the predetermined number of addresses have been stored; and performing a second verify to one or more cells indicated by the predetermined number of addresses, wherein the first verify is performed from a cell at the next fail according to the predetermined order after the second verify has finished.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 5 is a flowchart illustrating example second verify processing in the first embodiment.

FIG. 7 is a flowchart illustrating example erase test processing in a second embodiment.

DETAILED DESCRIPTION

Figure 1:
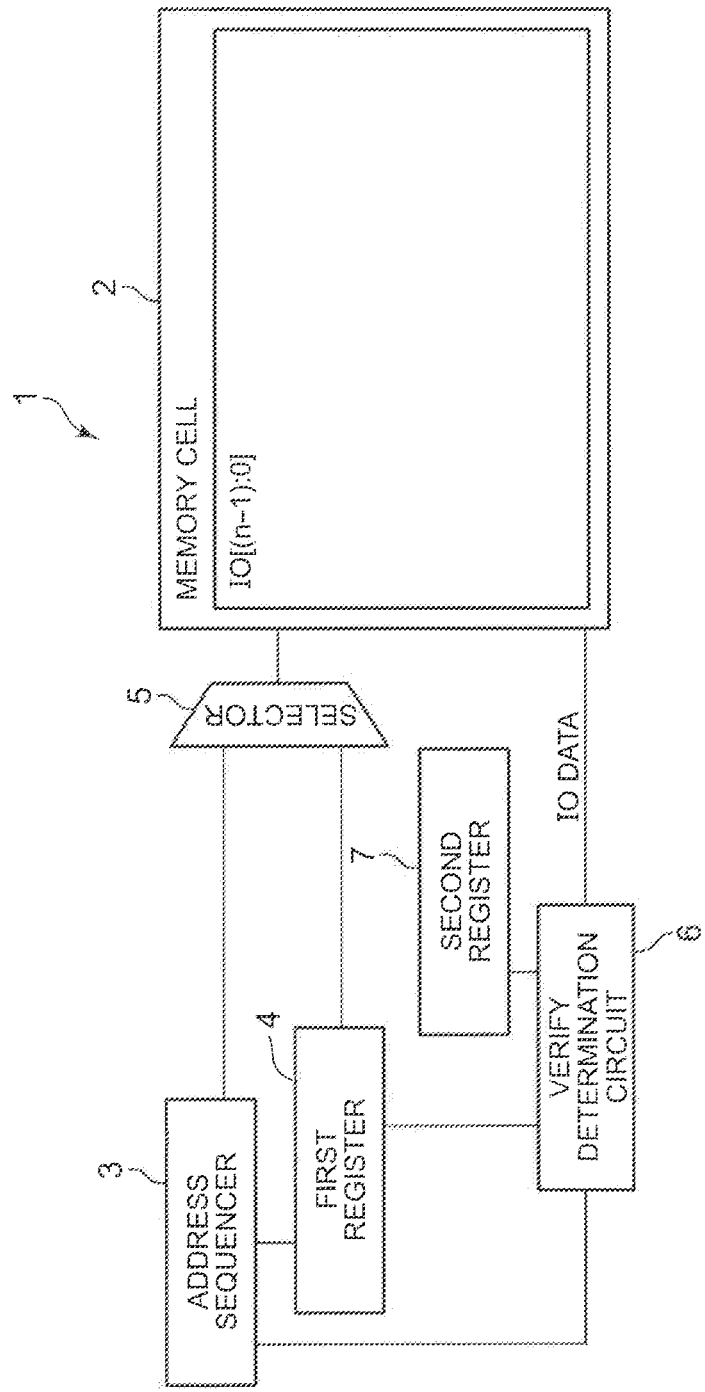
FIG. 1 is a diagram illustrating an example configuration of a semiconductor memory device according to a first embodiment.

In the following detailed description, reference is made to the accompanying drawings, which form a part of this specification. In the drawings, similar symbols typically identify similar components, unless context dictates otherwise. Further, the drawings are intended to be explanatory and may not be drawn to scale. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The following embodiments are illustrated for describing the present invention, and the present invention is not limited to the embodiments. Furthermore, the present invention can be modified in various ways insofar as they do not deviate from the scope of the invention. Moreover, a positional relation such as up, down, left, and right may be based on the positional relation as is illustrated in the drawings, unless otherwise specifically indicated. A dimensional ratio in the drawings is not limited to the shown ratio.

First Embodiment

FIG. 1 is a diagram illustrating an example schematic configuration of a semiconductor memory device according to a first embodiment. The semiconductor memory device 1 shown in FIG. 1 is, for example, a non-volatile memory such as a flash memory and has a memory cell 2, an address sequencer 3, a first register 4, a selector 5, a verify determination circuit 6, and a second register 7.

A plurality of memory cells are arranged in the memory cell 2 in a matrix form. In an embodiment, the memory cell 2 has a reference cell compared with each of normal memory cells (hereinafter simply also called cells) during a test. The memory cell 2 is also a memory cell array having a plurality of memory cell groups.

The address sequencer 3 generates addresses (e.g. column and row addresses) so that an erase test is performed in a predetermined order. The predetermined order includes, for example, the order of N letter type scans, etc. Any order may be adopted, however, that corresponds to when a predetermined cell is selected. The erase test is performed on, for example, a part of the memory cells in a sector that is an erase unit in the memory cell 2.

The address sequencer 3 acquires a determination result from the verify determination circuit 6. When the determination result is a fail, the address sequencer 3 stores the generated addresses in the first register 4. After the determination result has been acquired, the address sequencer 3 generates a next address in a predetermined order.

The first register 4 receives as input and stores from the address sequencer 3 one or more addresses of a cell determined to be the fail in the verify determination circuit 6. For example, a predetermined number n of addresses can be stored in the first register 4.

The selector 5 selects the addresses generated by the address sequencer 3 or selects the address stored in the first register 4. For example, the selector 5 may select any address on the basis of whether a predetermined number of addresses have been stored in the first register 4.

The verify determination circuit 6 obtains a result of a comparison between a current flowing in the reference cell and a current flowing in a memory cell targeted for testing, which has been selected by the selector 5. The verify determination circuit 6 outputs a verify determination result based on the result of comparison to the address sequencer 3. For example, if the current flowing in the memory cell to be tested is larger than the current flowing in the reference cell, the verify determination circuit 6 determines the erasure to be a pass. If the current flowing in the memory cell to be tested is smaller than the current flowing in the reference cell, the verify determination circuit 6 determines the erasure to be a fail.

At this time, the verify determination circuit 6 controls the address of the cell determined to be the fail so as to be stored in the first register 4 and stores information indicating that the fail address has been stored in the second register 7.

Thus, the fail address refers to the address of the cell determined to be the fail in the verify determination processing. The information indicating that the fail address has been stored is taken to be a High (H) level, for example. Information indicating that the fail address has not been stored is taken to be a Low (L) level.

When the fail address is stored in the first register 4, the second register 7 stores the H level therein. Or, when the fail address is not stored in the first register 4, the second register 7 stores the L level therein. When a predetermined number of addresses are stored in the first register 4, the second register 7 may store either one of the H and L levels for every storage region of the second register 7 corresponding to storage regions of the first register 4 where the respective addresses are stored.

In such a circuit as described above, the verify determination circuit 6 performs a first verify determination of a cell corresponding to each address generated by the address sequencer 3. Further, the verify determination circuit 6 performs a second verify determination of cells corresponding to a predetermined number of addresses after a predetermined voltage has been applied to a plurality of cells of an erase unit where there is a cell determined to be a fail in the first verify determination in a state in which the predetermined number of addresses have been stored in the first register 4.

For convenience of description, the verify performed on the cell corresponding to each address generated by the address sequencer 3 is called first verify, and a determination as to the first verify is called the first verify determination. Further, verify performed on the cell corresponding to each address stored in the first register 4 is called second verify, and a determination as to the second verify is described as the second verify determination. However, the first verify and the second verify, and the first verify determination and the second verify determination respectively perform similar processing.

Here, the selector 5 selects the address generated by the address sequencer 3 after the second verify determination has been finished. Since, at this time, the already-executed processing to be returned to the address sequencer is not generated, no loop of addresses occurs in the address sequencer 3. Thus, the addresses generated in the address sequencer 3 advance only in the forward direction in a predetermined order.

Further, since the stored fail address is selected only once in the second verify determination, no test operation is executed according to the predetermined order again after the return to the fail address.

Thus, according to the first embodiment, the address's loop is not generated (unlike those approaches that do generate the address's loop), and variations in test time are suppressed. Since the fail addresses are passed on a pseudo basis to advance test processing until the predetermined number of fail addresses are stored in the first register 4, a predetermined voltage is suppressed from being applied repeatedly by a failed cell that serves as a defective cell, and the predetermined voltage is suppressed from being excessively applied, even where the failed cell exists. That is, according to the first embodiment, it is possible to suppress the influence of the failed cell. Here, the application of the predetermined voltage for erasure is also called stress application.

Although the test is performed using the reference cell in the above, the test method is not limited to it. The verify determination circuit 6 may determine from a change in the voltage at a terminal of a memory cell to be tested, etc., whether or not erasing has been done properly. Further, a circuit that generates an internal voltage, a sense amplifier that compares currents, etc. are not illustrated in FIG. 1.

Figure 2:
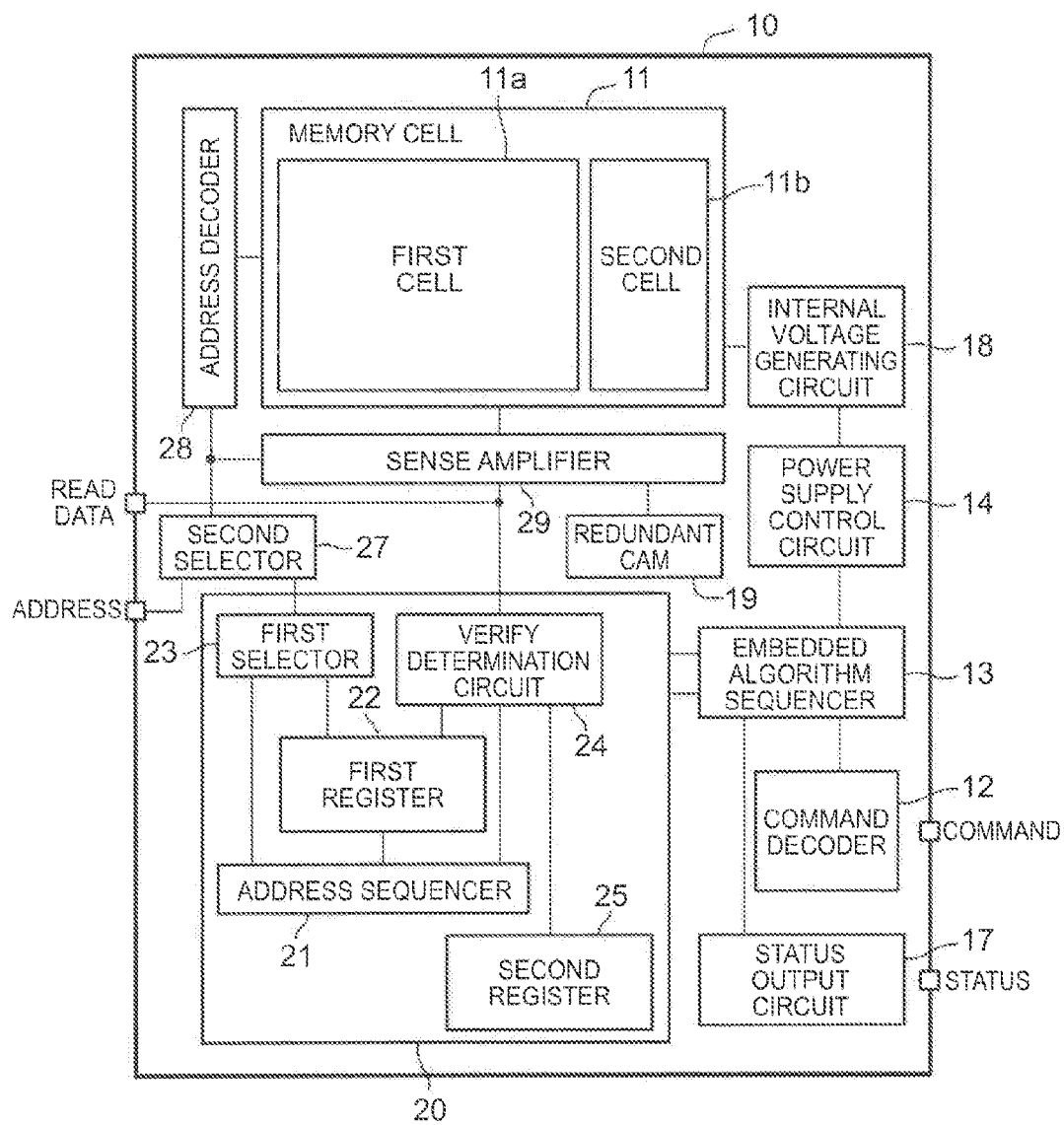
FIG. 2 is a diagram illustrating an example configuration of the semiconductor memory device according to the first embodiment.

FIG. 2 is a diagram showing an example of the configuration of the semiconductor memory device according to the first embodiment. The configuration shown in FIG. 2 describes a more detailed configuration than the configuration shown in FIG. 1. The semiconductor memory device 10 shown in FIG. 2 is a flash memory, for example. The semiconductor memory device 10 comprises a memory cell 11, a command decoder 12, an embedded algorithm sequencer 13, a power supply control circuit 14, an internal voltage generating circuit 18, a redundant CAM (Content Addressable Memory) 19, a test control circuit 20, a second selector 27, an address decoder 28 and a sense amplifier 29.

The test control circuit 20 includes an address sequencer 21, a first register 22, a first selector 23, a verify determination circuit 24, and a second register 25. The address sequencer 21, the first register 22, the first selector 23, the verify determination circuit 24, and the second register 25 correspond to the address sequencer 3, the first register 4, the selector 5, the verify determination circuit 6, and the second register 7 respectively.

A plurality of cells are arranged in the memory cell 11 in a matrix form. The memory cell 11 can include a first cell 11a and a second cell 11b for redundancy. A reference cell to be compared with a memory cell to be tested during testing may be arranged in the first cell 11a. The memory cell 11 is also a memory cell array having a plurality of memory cell groups.

The address decoder 28 applies a predetermined voltage to the gate of each cell of the memory cell 11, a bit line, etc. according to an address selected by the second selector 27.

The command decoder 12 is connected to an external terminal and determines through the external terminal a command such as a read command, a write command, an erase command or a test mode, etc., according to a chip enable signal, a write enable signal, a clock signal, and an address.

The embedded algorithm sequencer 13 controls execution of a write test, a read test, an erase test, etc., according to the test mode specified by the command decoder 12. Further, the embedded algorithm sequencer 13 outputs a signal indicative of the status of the semiconductor memory device 10 to a status output circuit 17.

The test control circuit 20 has the function of determining whether or not an erasure has properly been performed in an erase test under the control of the embedded algorithm sequencer 13. Further, the test control circuit 20 has a first register 22 which stores therein an address of a cell failed upon the erase test, a second register 25 which stores therein information indicative of whether or not the address has been stored in the first register 22, etc. Alternatively, the first register 22 and/or the second register 25 may be provided outside the test control circuit 20.

The power supply control circuit 14 generates a control signal for the internal voltage generating circuit 18 according to a signal from the embedded algorithm sequencer 13 and supplies the control signal to the internal voltage generating circuit 18.

The internal voltage generating circuit 18 generates various internal voltages, based on the control signal supplied from the power supply control circuit 14, and supplies them to the memory cell 11.

The redundant CAM 19 holds an address of each redundant failed cell therein. Write access and read access to the redundant CAM 19, etc., are controlled by an unillustrated CAM access control circuit. Thus, each cell determined to have been a fail during verify is substituted with a redundant cell. Further, the cells may be substituted with a group of redundant cells for every sector including failed cells.

For example, the CAM access control circuit performs redundant processing for substituting the cell determined to have been failed during verify, i.e., failed cell, with the second cell 11b for redundant use. At this time, the address of the failed cell is stored in the redundant CAM 19. When the address of the failed cell is designated, the substituted second cell 11b is selected.

The status output circuit 17 outputs the status of the semiconductor memory device 10 to the outside based on the signal obtained from the embedded algorithm sequencer 13.

The sense amplifier 29 is connected to the memory cell to be tested and the reference cell and performs a comparison between their corresponding currents. The sense amplifier 29 outputs a comparison result therebetween to the verify determination circuit 24. Further, the sense amplifier 29 outputs data from the selected cell to the outside as read data.

The address sequencer 21 obtains a determination result from the verify determination circuit 24 to thereby generate a next address in a predetermined order. The erase test is performed on a part of memory cells in a sector being an erase unit in the memory cell 11. When the determination result is obtained from the verify determination circuit 24 and taken to be a fail, the address sequencer 21 stores the generated address in the first register 22.

The first register 22 receives as input and stores from the address sequencer 21 one or more addresses of the cell determined to be the fail in the verify determination circuit 24. For example, a predetermined number n of addresses can be stored in the first register 22.

The first selector 23 selects the address generated by the address sequencer 21 or the address stored in the first register 22. For example, the first selector 23 may select any address on the basis of whether or not the predetermined number of addresses have been stored in the first register 22.

The verify determination circuit 24 obtains the result of comparison between the current flowing in the reference cell and the current flowing in the memory cell to be tested selected by the first selector 23, which has been carried out by the sense amplifier 29. The verify determination circuit 24 outputs a verify determination result based on the result of comparison to the address sequencer 21. For example, the verify determination circuit 24 determines the erasure to be a completion (pass) if the current of the memory cell to be tested is larger than the current of the reference cell. If the current of the memory cell to be tested is smaller than the current of the reference cell, the verify determination circuit 24 determines the erasure to be a non-completion (fail).

At this time, the verify determination circuit 24 controls the address of the cell determined to be the fail in the verify determination to be stored in the first register 22 and stores information indicating that the fail address has been stored in the second register 25.

The second register 25 stores an H level as the information indicating that the fail address has been stored, and stores an L level as information indicating that the fail address has not been stored. When the predetermined number of addresses are stored in the first register 22, the second register 25 stores either one of the H and L levels for every storage region of the second register 25 corresponding to storage regions of the first register 22 where the respective addresses are stored.

The second selector 27 inputs an external address from an address terminal and obtains an address from the first selector 23. When the erase test is carried out, the second selector 27 selects the address from the first selector 23. When reading and writing of data are performed, the second selector 27 selects the external address.

According to such a test control circuit 20 as described above, the verify determination circuit 24 performs the first verify determination of the cell corresponding to the address generated by the address sequencer 21. Further, when there is the cell determined to be the fail in the first verify in the state in which the predetermined number of addresses have been stored in the first register 22, the verify determination circuit 24 performs the second verify determination of the cells corresponding to the predetermined number of addresses in order after the predetermined voltage has been applied to the plurality of cells of the erase unit.

Here, the first selector 23 selects the address generated by the address sequencer 21 after the second verify has been finished. Since, at this time, the already-executed processing to be returned to the address sequencer is not generated, no loop of addresses occurs in the address sequencer 21. Thus, each address generated in the address sequencer 21 advances only in the forward direction in a predetermined order.

Erase Test Processing

Figure 3:
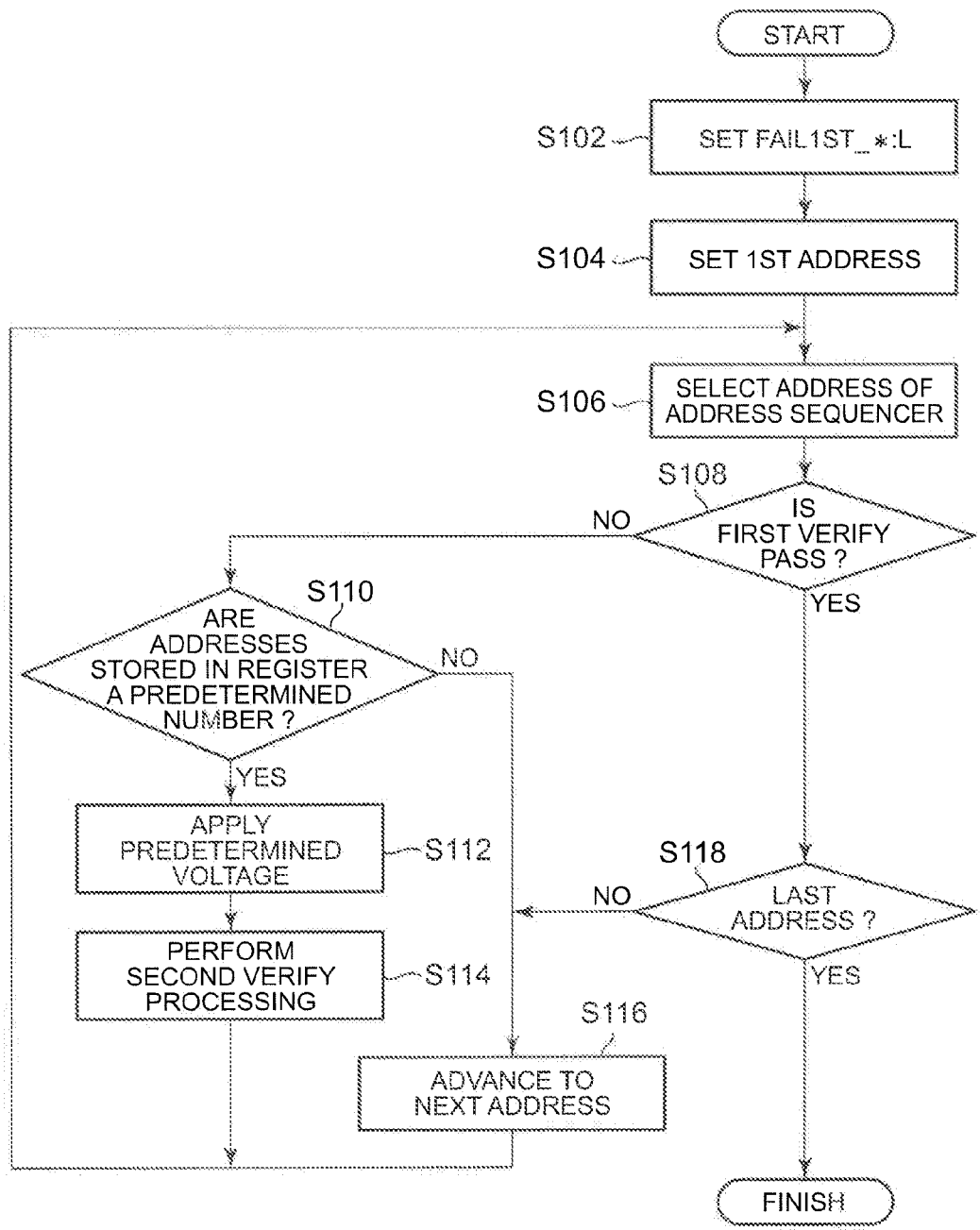
FIG. 3 is a flowchart illustrating example erase test processing in the first embodiment.

FIG. 3 is a flowchart showing example erase test processing in the first embodiment. In Step S102 shown in FIG. 3, an initial value L is set to FAIL1ST_*1 as the second register 25.

In Step S104, a first address is set to the address sequencer 21. The address sequencer 21 sequentially generates addresses in a predetermined order.

In Step S106, the first selector 23 selects the address of the address sequencer 21.

In Step S108, the verify determination circuit 24 determines whether or not the result of a first verify performed on a cell corresponding to the address selected by the first selector 23 is a pass. If the determination result is found to be the pass (the answer is YES in Step S108), the erase test processing proceeds to Step S118. If the determination result is found to be a fail (the answer is NO in Step S108), the erase test processing proceeds to Step S110.

In Step S110, the verify determination circuit 24 determines whether or not the addresses stored in the first register 22 are a predetermined number. This determination processing will be described in detail using FIG. 4. If the result of determination is affirmative (the answer is YES in Step S110), the erase test processing proceeds to Step S112. If the result of determination is negative (the answer is NO in Step S110), the erase test processing proceeds to Step S116.

In Step S112, a predetermined voltage is applied to a cell group targeted for erasure including a memory cell selected by the first selector 23.

In Step S114, second verify processing is performed on the address selected by the first selector 23. In the second verify processing, the address selected at this time is the address stored in the first register 22. This second verify processing will be described in detail using FIG. 5. When the second verify processing is finished, the erase test processing returns to Step S106, where the first selector 23 selects the address of the address sequencer 21.

In Step S116, when the pass has been taken in the first verify (the answer is NO in Step S118), or the addresses have been stored in the first register 22 (the answer is NO in Step S110) as will be described in FIG. 4, the address sequencer 21 generates a next address in a predetermined order.

In Step S118, the address sequencer 21 determines whether or not the generated address is the last address. If the result of determination is found to be the last address (the answer is YES in Step S118), the erase test processing is finished. If the result of determination is found not to be the last address (the answer is NO in Step S118), the erase test processing proceeds to Step S116.

Figure 4:
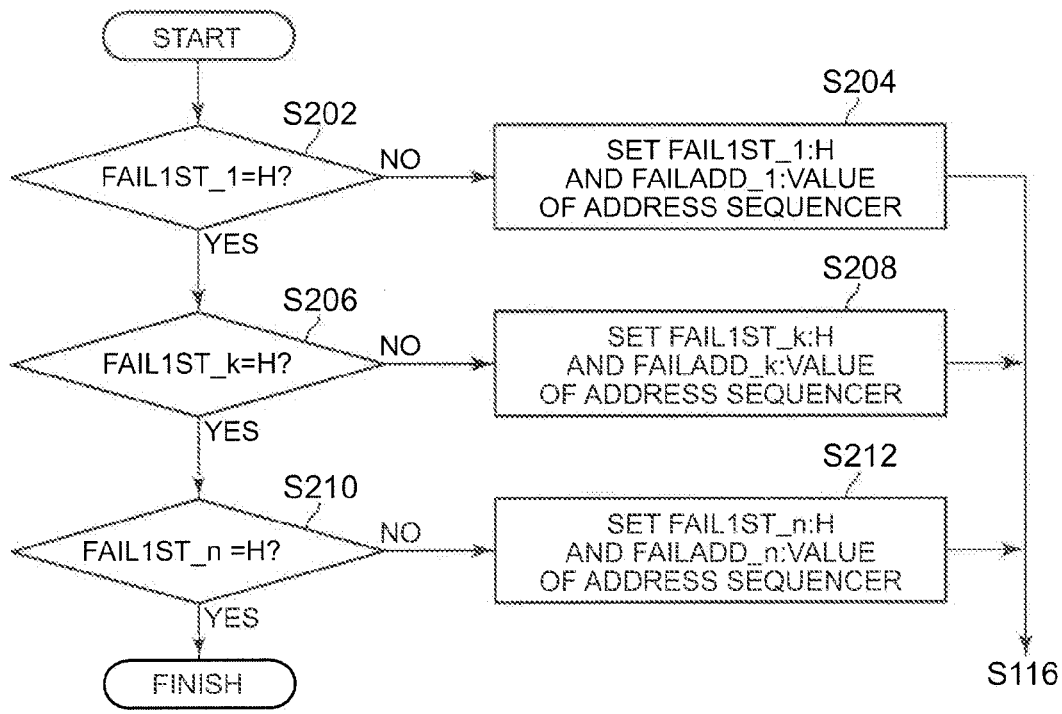
FIG. 4 is a flowchart illustrating example processing of a determination as to each of addresses stored in a register in the first embodiment.

FIG. 4 is a flowchart showing example processing of a determination as to each of the addresses stored in the register in the first embodiment. The processing shown in FIG. 4 corresponds to the processing of Step S110. In Step S202, the verify determination circuit 24 determines whether or not FAIL1ST_1 of the second register 25 is H. If FAIL1ST=H (the answer is YES in Step S202), the processing proceeds to Step S206. If FAIL1ST=L (the answer is NO in Step S202), the processing proceeds to Step S204.

In Step S204, if FAIL1ST_1=L and the result of determination is found to be a fail, the verify determination circuit 24 sets FAIL1ST_1 to FAIL1ST_1=H and controls the address of the address sequencer 21 so as to be set to FAILADD_1 of the first register 22.

In Step S206, the verify determination circuit 24 determines whether or not FAIL1ST_k (where k=2, 3, . . . , n−1) of the second register 25 is H. If FAIL1ST_k=H (the answer is YES in Step S206), the processing proceed to Step S208. If FAIL1ST_k=L (the answer is NO in Step S206), the processing proceeds to Step S210. The determination of Step S206 is executed in succession with 1 added to k insofar as the result of determination is affirmative.

In Step S208, if FAIL1ST_k=L and the result of determination is found to be the fail, the verify determination circuit 24 sets FAIL1ST_k to FAIL1ST_k=H and controls the address of the address sequencer 21 so as to be set to FAILADD_k of the first register 22. In Step S210, the verify determination circuit 24 determines whether or not FAIL1ST_n of the second register 25 is H. If FAIL1ST_n=H (the answer is YES in Step S210), the processing is finished. If FAIL1ST_n=L (the answer is NO in Step S210), the processing proceeds to Step S212. When the processing shown in FIG. 4 is finished, the processing proceeds to S112.

In Step S212, if FAIL1ST_n=L and the result of determination is found to be the fail, the verify determination circuit 24 sets FAIL1ST_n to FAIL1ST_n=H and controls the address of the address sequencer 21 to be set to FAILADD_n of the first register 22.

After the processing of Step S204, S208 or Step 212 is finished, the processing subsequently proceeds to Step S116.

FIG. 5 is a flowchart showing example processing of the second verify processing in the first embodiment. The processing shown in FIG. 5 corresponds to the processing of Step S114. In Step S302, the first selector 23 selects the address stored in FAILADD_1.

In Step S304, the verify determination circuit 24 determines whether or not the result of a second verify executed on the address selected by the first selector 23 is a pass. If the result of determination is found to be the pass (the answer is YES in Step S304), the processing proceeds to Step S306. If the result of determination is found to be a fail (the answer is NO in Step S304), the processing proceeds to Step S308.

In Step S306, the verify determination circuit 24 sets FAIL1ST_1 of the second register 25 to L.

In Step S308, the first selector 23 selects the address stored in FAILADD_k.

In Step S310, the verify determination circuit 24 determines whether or not the result of the second verify performed on the address selected by the first selector 23 is the pass. If the result of determination is found to be the pass (the answer is YES in Step S310), the processing proceeds to Step S312. If the result of determination is found to be the fail (the answer is NO in Step S310), the processing proceeds to Step S314. The processing of Steps S308 and S310 is executed in succession with 1 added to k insofar as the result of determination is negative.

In Step S312, the verify determination circuit 24 sets FAIL1ST_k of the second register 25 to L.

In Step S314, the first selector 23 selects the address stored in FAILADD_n.

In Step S316, the verify determination circuit 24 determines whether or not the result of the second verify performed on the address selected by the first selector 23 is the pass. If the result of determination is found to be the pass (the answer is YES in Step S316), the processing proceeds to Step S318. If the result of determination is found to be the fail (the answer is NO in Step S316), the processing is finished.

In Step S318, the verify determination circuit 24 sets FAIL1ST_n of the second register 25 to L. After it has been determined in Step S316 that the answer is NO or the processing of Step S318 has been conducted, the processing returns to Step S106.

By the above processing, in the first embodiment, it is understood that no loop of the addresses is generated because the addresses generated by the address sequencer 21 are generated in the forward direction in the predetermined order. Since the verify for each failed cell is passed on the pseudo basis to continue the test processing until the addresses of the predetermined number of failed cells are stored in the first register 22, it is possible to prevent the excessive application of stress due to the failed cell and reduce its influence.

EXAMPLES

Figure 6A:
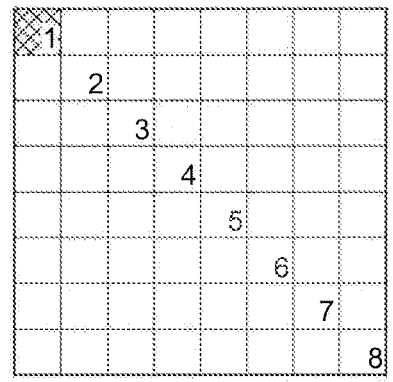
FIG. 6A to FIG. 6R are respectively diagrams for describing example erase test processing in the first embodiment.
Figure 6B:
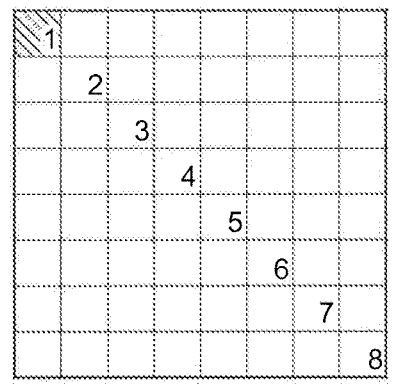
Figure 6C:
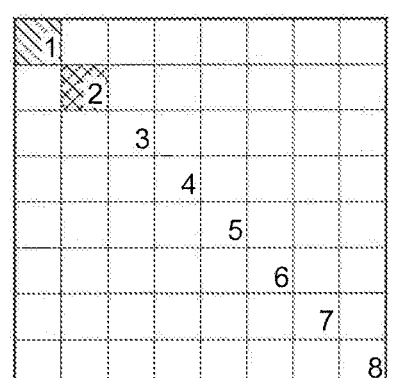
Figure 6D:
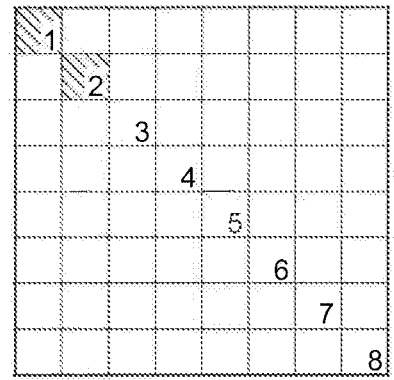
Figure 6E:
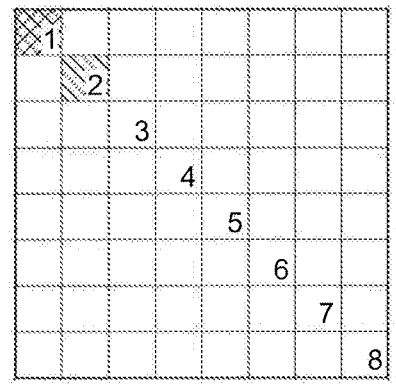
Figure 6F:
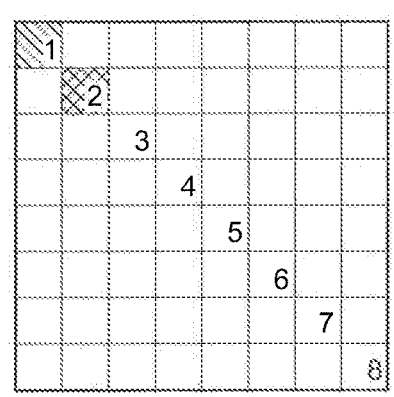
Figure 6G:
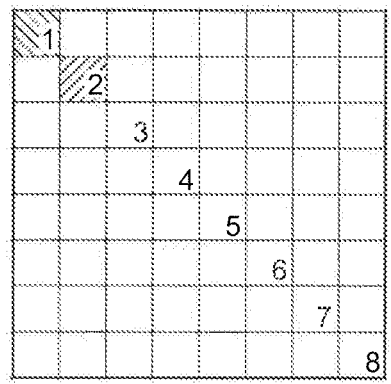
Figure 6H:
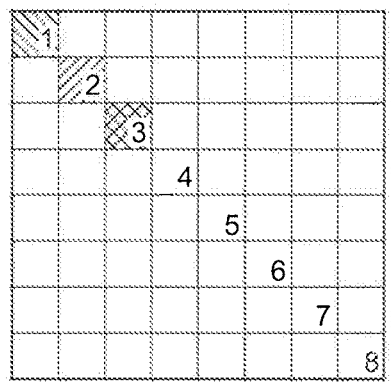
Figure 6I:
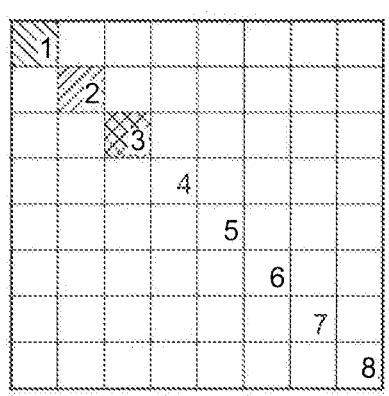
Figure 6J:
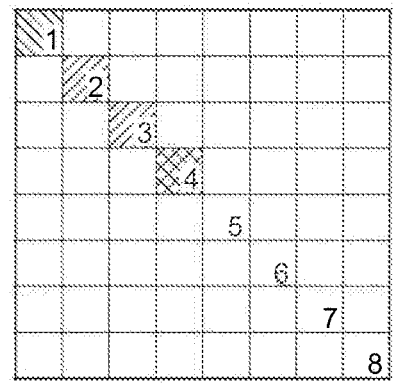
Figure 6K:
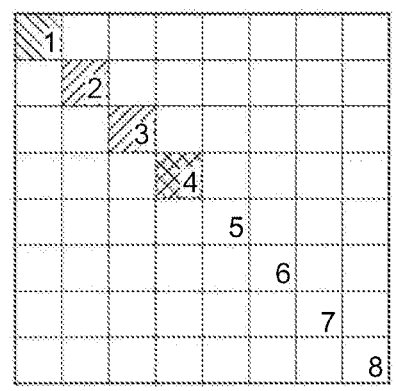
Figure 6L:
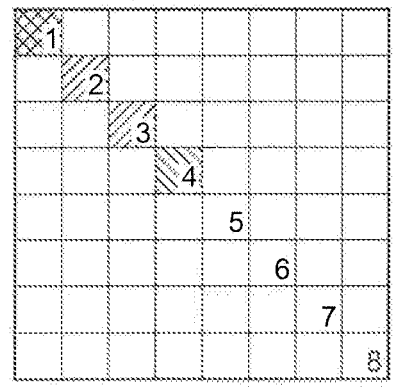
Figure 6M:
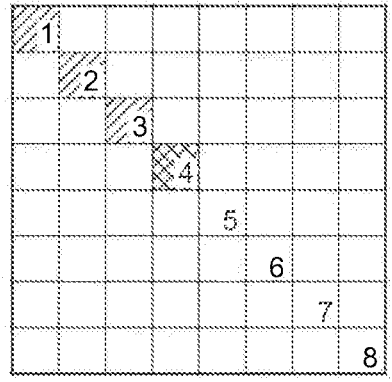
Figure 6N:
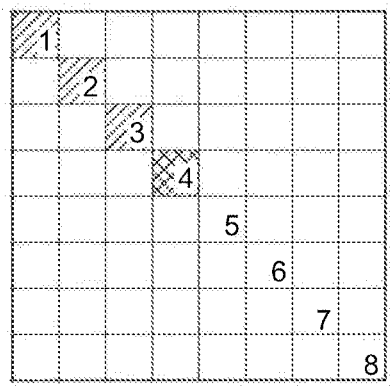
Figure 6O:
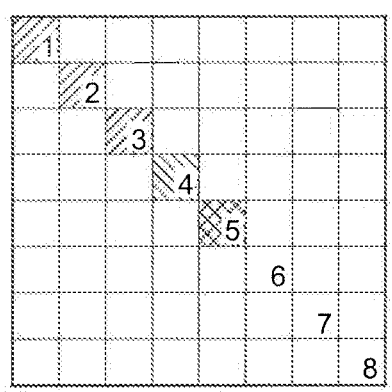
Figure 6P:
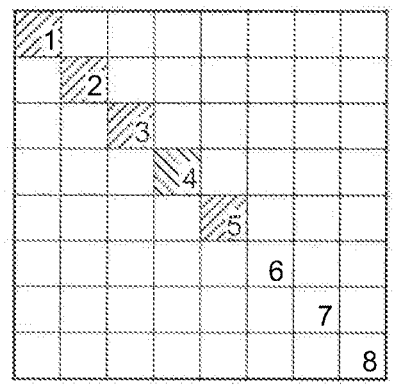
Figure 6Q:
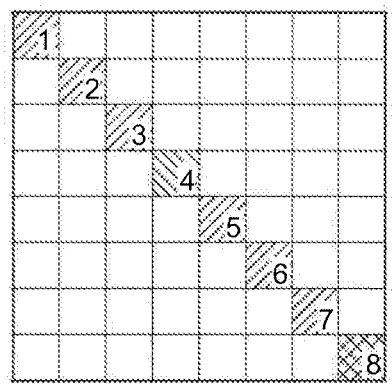
Figure 6R:
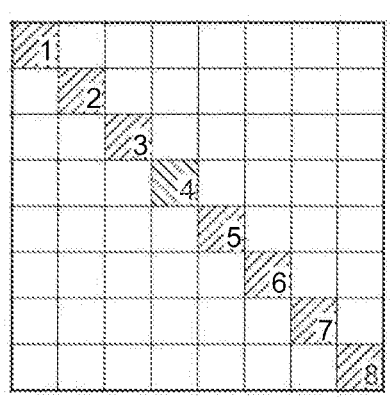

The erase test processing in the first embodiment where the predetermined number is 1 (n=1) will next be described using FIG. 6A to FIG. 6R. FIG. 6A to FIG. 6R are respectively diagrams for describing erase test processing where the predetermined number is taken to be 1. As items common to FIG. 6, a matrix of 8×8 indicates, for example, a cell group of an erase unit. Numbers 1 to 8 indicate, for example, the addresses of cells. Further, each lattice-pattern cell is a cell corresponding to an execution address in the erase test. Each cell with diagonally lower right oblique lines is a cell corresponding to a fail address. Each cell with diagonally lower left oblique lines is a cell corresponding to a pass address. A predetermined order takes the order of the upper left to lower right cells. Incidentally, in this example, an address "4" is taken to be a failed cell.

FIG. 6A shows an example processing stage 1 in the erase test processing. In FIG. 6A, an address "1" is set as an execution address in the predetermined order (S104). The state in the semiconductor memory device 10 at this time is as follows:
Address sequencer: 1
First register: initial value
FAIL1ST_1: L FIG. 6B shows an example processing stage 2 in the erase test processing. Since it is the first processing in FIG. 6B, there is shown a case where a fail is taken in the first verify relative to a cell of the execution address (S108—NO). The state in the semiconductor memory device 10 at this time is as follows:
Address sequencer: 1
First register: initial value
FAIL1ST_1: L FIG. 6C shows an example processing stage 3 in the erase test processing. In FIG. 6C, the cell of the address "1" assumes a fail. This is however passed on a pseudo basis, i.e., ignored. The address "1" is stored in the first register 22 (S204), and the execution address becomes an address "2" (S116). The state in the semiconductor memory device 10 at this time is as follows:
Address sequencer: 2
First register: 1
FAIL1ST_1: H FIG. 6D shows an example processing stage 4 in the erase test processing. There is shown in FIG. 6D, a case where the first verify is performed on a cell of the execution address "2" and the cell assumes a fail (S108—NO). Since the predetermined number (n 1) of addresses have been stored in the first register 22 (S110—YES) here, erasing stress is applied to an erase unit (S112). The state in the semiconductor memory device 10 at this time is as follows:
Address sequencer: 2
First register: 1
FAIL1ST_1: H FIG. 6E shows an example processing stage 5 in the erase test processing. In FIG. 6E, after the application of the stress, the first fail address stored in the first register 22 is set to an execution address "1" (S302). The state in the semiconductor memory device 10 at this time is as follows:
Address sequencer: 2
First register: 1
FAIL1ST_1: H FIG. 6F shows an example processing stage 6 in the erase test processing. In FIG. 6F, a second verify is performed on a cell of an execution address (S304). When the fail is taken again at this time, the first register 22 and FAIL1ST_1 remain unchanged, and the execution address becomes the address of the address sequencer 21. The state in the semiconductor memory device 10 at this time is as follows:
Address sequencer: 2
First register: 1
FAIL1ST_1: H FIG. 6G shows an example processing stage 7 in the erase test processing. In FIG. 6G, the first verify is performed on the cell of the address of the address sequencer 21 and taken to have been passed (S108—YES). Next, a determination as to the last address is done and the result of determination is found to be NO (S118—NO). The state in the semiconductor memory device 10 is as follows:
Address sequencer: 2
First register: 1
FAIL1ST_1: H FIG. 6H shows an example processing stage 8 in the erase test processing. In FIG. 6H, the address of the address sequencer 21 is advanced to the next (Step S116) and the first verify is performed (S108). The state in the semiconductor memory device 10 at this time is as follows:
Address sequencer: 3
First register: 1
FAIL1ST_1: H FIG. 6I shows an example processing stage 9 in the erase test processing. In FIG. 6I, as a result of determination in the first verify, it is taken to have assumed the pass (S108—YES). Next, a determination as to the last address is done and the result of determination is found to be NO (S118—NO). The state in the semiconductor memory device 10 at this time is as follows:
  Address sequencer: 3
  First register: 1
  FAIL1ST_1: H FIG. 6J shows an example processing stage 10 in the erase test processing. In FIG. 6J, the address of the address sequencer 21 is advanced to the next (Step S116). The execution address becomes "4" and the first verify is performed (S108). The state in the semiconductor memory device 10 at this time is as follows:
  Address sequencer: 4
  First register: 1
  FAIL1ST_1: H FIG. 6K shows an example processing stage 11 in the erase test processing. In FIG. 6K, the first verify is taken to be the fail (S108—NO). Next, since FAIL1ST_1 is H (S202—YES), the processing proceeds to Step S112. The state in the semiconductor memory device 10 at this time is as follows:
  Address sequencer: 4
  First register: 1
  FAIL1ST_1: H FIG. 6L shows an example processing stage 12 in the erase test processing. In FIG. 6L, stress for erasure is applied (S112). Next, the fail address of the first register 22 becomes the execution address "1" (S302). The second verify is performed and taken to have assumed the pass (S304—YES). The state in the semiconductor memory device 10 at this time is as follows:
  Address sequencer: 4
  First register: 1
  FAIL1ST_1: H FIG. 6M shows an example processing stage 13 in the erase test processing. Since the second verify assumes the pass in FIG. 6M, FAIL1ST_1 is set to L (S306). Next, the address "4" of the address sequencer 21 becomes an execution address (S106), and the first verify is executed (S108). The state in the semiconductor memory device 10 at this timed is as follows:
  Address sequencer: 4
  First register: 1
  FAIL1ST_1: L FIG. 6N shows an example processing stage 14 in the erase test processing. Since the cell of the address "4" is a failed cell in FIG. 6N, the first verify assumes the fail (S108—NO), and FAIL1ST_1 is L (S202—NO). The state in the semiconductor memory device 10 at this time is as follows:
  Address sequencer: 4
  First register: 1
  FAIL1ST_1: L FIG. 6O shows an example processing stage 15 in the erase test processing. In FIG. 6O, "H" is set to FAIL1ST_1, and the address "4" of the address sequencer 21 is set to FAIL-ADD_1 (S204). Next, the address of the address sequencer 21 is advanced to the next and becomes an address "5" (S116). The state in the semiconductor memory device 10 at this time is as follows:
  Address sequencer: 5
  First register: 4
  FAIL1ST_1: H FIG. 6P shows an example processing stage 16 in the erase test processing. In FIG. 6P, the address "5" of the address sequencer 21 is selected (S106). The first verify is performed on the cell of this address and taken to have assumed the pass (S108—YES). Next, a determination as to the last address is conducted, and the result of determination is found to be NO (S118—NO). The state in the semiconductor memory device 10 at this time is as follows:
  Address sequencer: 5
  First register: 4
  FAIL1ST_1: H FIG. 6Q shows an example processing stage 17 in the erase test processing. Incidentally, the addresses "6" and "7" are taken to have been passed in the first verify. In FIG. 6Q, the address "8" of the address sequencer 21 is selected (S106). The first verify is performed on the cell of this address and taken to have assumed the pass (S108 —YES). The state in the semiconductor memory device 10 at this time is as follows:
  Address sequencer: 8
  First register: 4
  FAIL1ST_1: H FIG. 6R shows an example processing stage 18 in the erase test processing. In FIG. 6R, a determination as to the last address is conducted, and the result of determination is found to be YES (S118—YES). Thus, the processing is finished. The state in the semiconductor memory device 10 at this time is as follows:
  Address sequencer: 8
  First register: 4
  FAIL1ST_1: H According to the example described above, one failed cell can be passed on the pseudo basis to continue the operation of the erase test. In the example, it was possible to pass one failed cell on the pseudo basis because the predetermined number has been set to 1. In the first embodiment, the predetermined number of failed cells can be passed on the pseudo basis. This is because the predetermined number of failed cells can be found appropriately, and hence the present embodiment can be used even in a user mode. For example, if it is possible to correct a predetermined number of bit errors by an ECC (Error Correcting Code), the semiconductor memory device according to the first embodiment can be used even in the market even if defects have occurred in a predetermined number of bits.

Referring to FIG. 3 and FIG. 4, the address sequencer 21 in the first embodiment generates the next address in the predetermined order where the pass is taken in the first verify (S108—YES) or the address is stored in the first register 22 (S204, S208 and S212) (S116). That is, the address sequencer 21 does not cause the loop of the addresses because it generates the addresses only in the forward direction in the predetermined order. Therefore, in the first embodiment, variations in test time are reduced. Since the verify relative to each failed cell is passed on the pseudo basis to continue test processing until the predetermined number of addresses of the failed cells are stored in the first register 22, it is possible to prevent excessive application of stress due to the failed cell and reduce its influence.

Second Embodiment

A semiconductor memory device according to a second embodiment will next be described. In the second embodiment, the function of the second register 7 is assigned to an empty address of the first register 22. A circuit configuration in the second embodiment is equivalent to a configuration in which the second register 7 is deleted from the circuit configuration in the first embodiment. Accordingly, the description of the circuit configuration in the second embodiment will be omitted. For convenience of description, components in the second embodiment will be described with "a" being attached to reference numerals of the components in the first embodiment as reference numerals of the components in the second embodiment. For example, reference numeral of the address sequencer in the second embodiment is given as "21a".

Erase Test Processing

FIG. 7 is a flowchart showing example erase test processing in the second embodiment. In Step S402 shown in FIG. 7, BA (Blank Address) is set to FAILADD_1 of the first register 22a.

In Step S404, a first address is set to the address sequencer 21a. The address sequencer 21a subsequently generates addresses in a predetermined order.

In Step S406, the first selector 23a selects the address of the address sequencer 21a.

In Step S408, the verify determination circuit 24a determines whether or not the result of a first verify executed on a cell corresponding to the address selected by the first selector 23a is a pass. If the result of determination is found to be the pass (the answer is YES in Step S408), the erase test processing proceeds to Step S418. If the result of determination is found to be a fail (the answer is NO in Step S408), the erase test processing proceeds to Step S410.

In Step S410, the verify determination circuit 24a determines whether or not the addresses stored in the first register 22a are a predetermined number. This determination result will be described in detail using FIG. 8. If the determination result is affirmative (the answer is YES in Step S410), the erase test processing proceeds to Step S412. If the determination result is negative (the answer is NO in Step S410), the erase test processing proceeds to Step S416.

In Step S412, a predetermined voltage is applied to a cell group targeted for erasure including a memory cell selected by the first selector 23a.

In Step S414, second verify processing is performed on a cell of each address (in this case, the addresses stored in the first register 22a) selected by the first selector 23. This second verify processing will be described in detail using FIG. 9. When the second verify processing is finished, the erase test processing returns to Step S406, where the first selector 23a selects the address of the address sequencer 21a.

Figure 9:
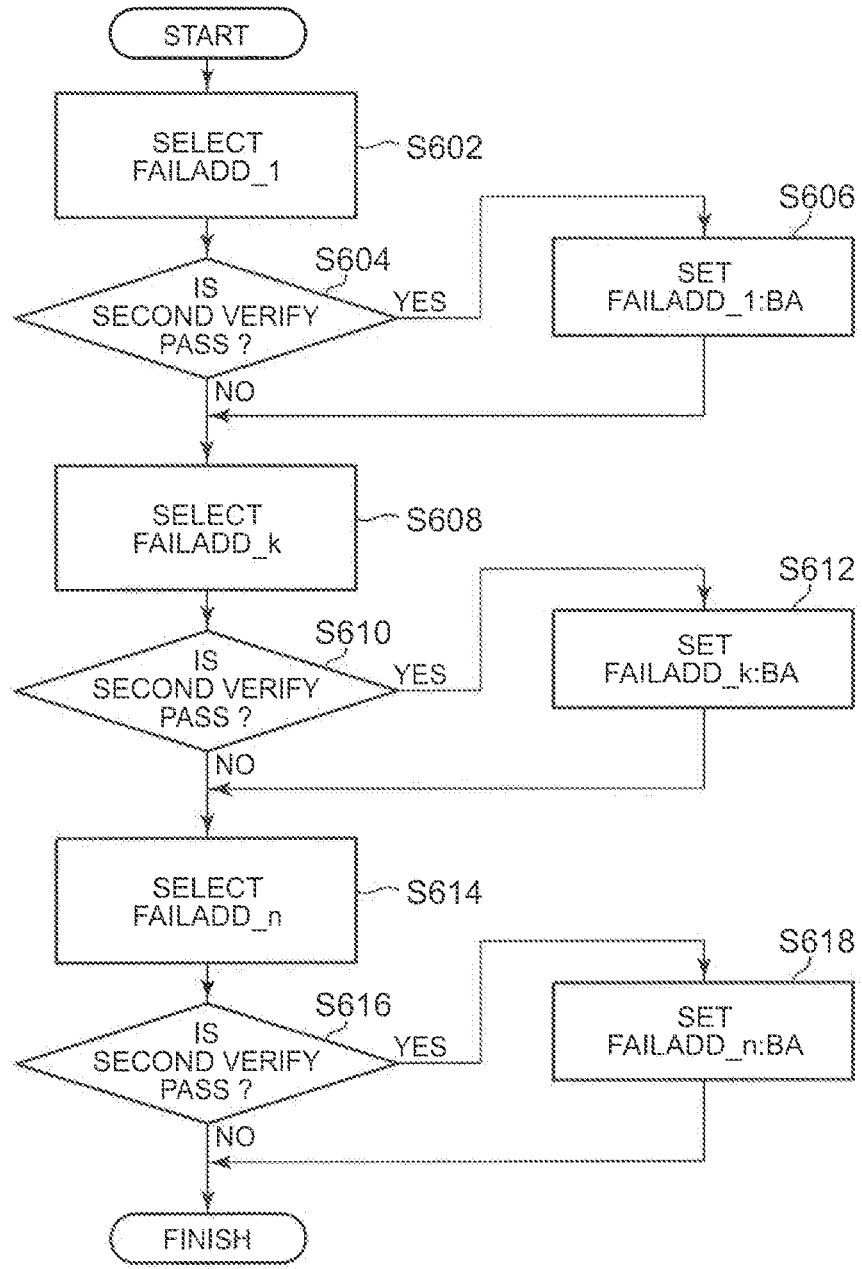
FIG. 9 is a flowchart illustrating example second verify processing in the second embodiment.

In Step S416, when the pass has been taken in the first verify (the answer is NO in Step S418), or the addresses have been stored in the first register 22a (the answer is NO in Step S410) as described in FIG. 9, the address sequencer 21a generates a next address in a predetermined order.

In Step S418, the address sequencer 21a determines whether or not the generated address is the last address. If the result of determination is found to be the last address (the answer is YES in Step S418), the erase test processing is finished. If the result of determination is found not to be the last address (the answer is NO in Step S418), the erase test processing proceeds to Step S416.

Figure 8:
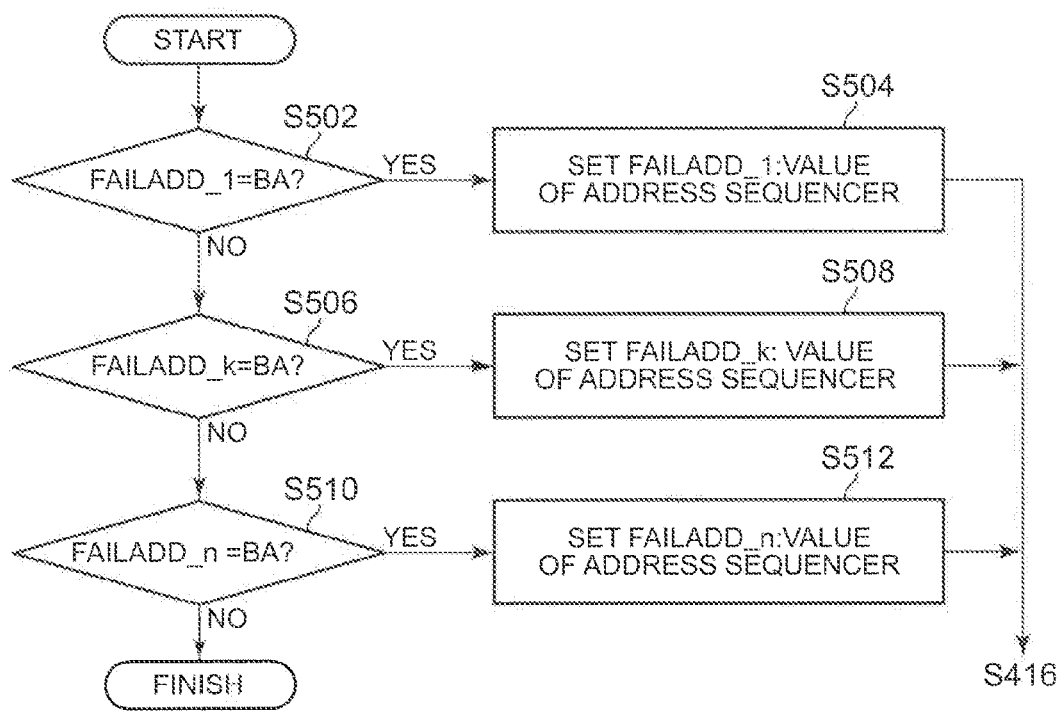
FIG. 8 is a flowchart illustrating example processing of a determination as to addresses stored in a register in the second embodiment.

FIG. 8 is a flowchart showing example processing of a determination as to each of the addresses stored in the register in the second embodiment. The processing shown in FIG. 8 corresponds to the processing of Step S410. In Step S502, the verify determination circuit 24a determines whether or not FAILADD_1 of the second register 22a is BA. If FAILADD_1=BA (the answer is YES in Step S502), the processing proceeds to Step S504. If FAILADD_1 is not BA (the answer is NO in Step S502), the processing proceeds to Step S506.

In Step S504, the verify determination circuit 24a controls the address of the address sequencer 21a so as to be set to FAILADD_1 of the first register 22a In Step S506, the verify determination circuit 24a determines whether or not FAILADD_k (where k=2, 3, ..., n-1) of the second register 22a is BA. If FAILADD_k is BA (the answer is YES in Step S506), the processing proceeds to Step S508. If FAILADD_k is not BA (the answer is NO in Step S506), the processing proceeds to Step S510. The determination of Step S506 is continuously executed with 1 added to k insofar as the result of determination is negative.

In Step S508, the verify determination circuit 24a controls the address of the address sequencer 21a so as to be set to FAILADD_k of the first register 22a.

In Step S510, the verify determination circuit 24a determines whether or not FAILADD_n of the first register 22a is BA. If FAILADD_n is not BA (the answer is NO in Step S510), the processing is finished. If FAILADD_n is BA (the answer is YES in Step S510), the processing proceeds to Step S512. When the processing shown in FIG. 8 is finished, the processing subsequently proceeds to S412.

In Step S512, the verify determination circuit 24a controls the address of the address sequencer 21a to be set to FAILADD_n of the first register 22a.

After the processing of Step S504, S508, or Step S512 is finished, the processing subsequently proceeds to Step S416.

FIG. 9 is a flowchart showing example second verify processing in the second embodiment. The processing shown in FIG. 9 corresponds to the processing of Step S414. In Step S602, the first selector 23a selects the address stored in FAILADD_1.

In Step S604, the verify determination circuit 24a determines whether or not the result of a second verify executed on a cell of the address selected by the first selector 23a is a pass. If the result of determination is found to be the pass (the answer is YES in Step S604), the processing proceeds to Step S606. If the result of determination is found to be a fail (the answer is NO in Step S604), the processing proceeds to Step S608.

In Step S606, the verify determination circuit 24a sets FAILADD_1 of the first register 22a to BA.

In Step S608, the first selector 23a selects the address stored in FAILADD_k.

In Step S610, the verify determination circuit 24a determines whether or not the result of the second verify performed on the cell of the address selected by the first selector 23a is a pass. If the result of determination is found to be the pass (the answer is YES in Step S610), the processing proceeds to Step S612. If the result of determination is found to be a fail (the answer is NO in Step S610), the processing proceeds to Step S614. The processing of Steps S608 and S610 is executed in succession with 1 added to k insofar as the result of determination is negative.

In Step S612, the verify determination circuit 24a sets FAILADD_k of the first register 22a to BA.

In Step S614, the first selector 23a selects the address stored in FAILADD_n.

In Step S616, the verify determination circuit 24a determines whether or not the result of the second verify executed on a cell of the address selected by the first selector 23a is a pass. If the result of determination is found to be the pass (the answer is YES in Step S616), the processing proceeds to Step S618. If the result of determination is found to be a fail (the answer is NO in Step S616), the processing is finished.

In Step S618, the verify determination circuit 24a sets FAILADD_n of the first register 22a to BA. After the answer has been determined to be NO in Step S616 or after the processing of Step S618, the processing returns to Step S406.

By the above processing in the second embodiment, the function of the second register 7 can also be assigned to an empty address of the first register 22. When BA has been set to FAILADD, a cell at BA is taken to be unused. Thus, the semiconductor memory device according to the second embodiment brings about an advantageous effect similar to the effect described above in the first embodiment.

Third Embodiment

A semiconductor memory device according to a third embodiment will next be described. While the first embodiment and the second embodiment have described the processing in the test mode during the erase test, the third embodiment will describe processing in a user mode that a user utilizes in the market. Since the failed cells can reliably be narrowed down to a predetermined number or less in the third embodiment, the semiconductor memory device can be used in a user mode if ECC that corrects errors in failed cells of a predetermined number or less is used.

A circuit configuration in the third embodiment is equivalent to a configuration in which a third register that stores a count value of a failed cell is added to the circuit configuration in the first embodiment. The description of the circuit configuration in the third embodiment will be omitted. For convenience of description, components employed in the third embodiment will be described with "b" being attached to reference numerals of the components in the first embodiment as reference numerals of the components in the third embodiment. For example, reference numeral of the address sequencer in the third embodiment is given as "21b".

Erase Processing

Figure 10:
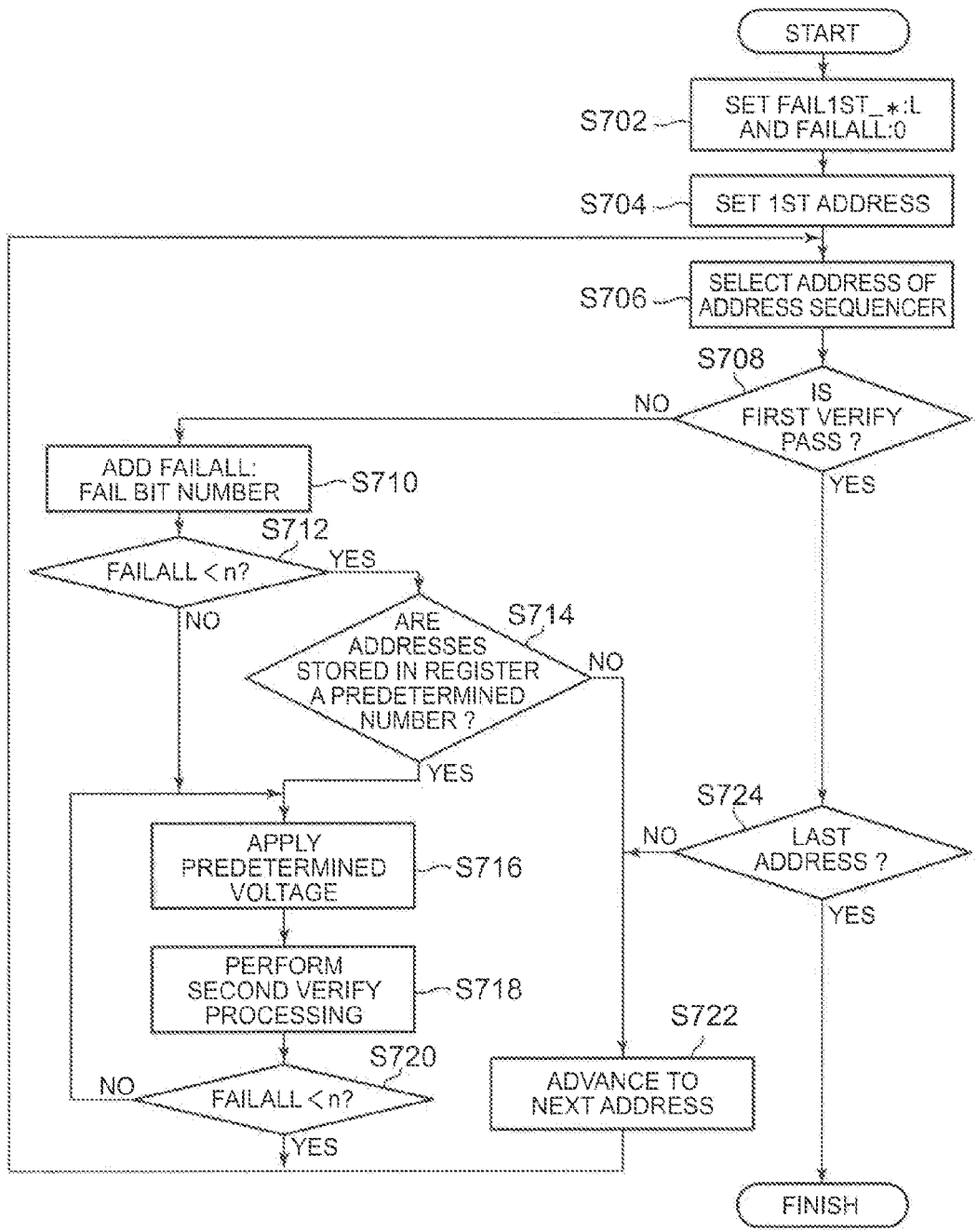
FIG. 10 is a flowchart illustrating example erase processing in a third embodiment.

FIG. 10 is a flowchart showing example erase processing in the third embodiment. In Step S702 shown in FIG. 10, an initial value L is set to FAIL1ST_*1 of the second register 25b, and 0 is set to FAILALL of the third register.

In Step S704, a 1st address is set to the address sequencer 21b. The address sequencer 21b sequentially generates addresses in a predetermined order.

In Step S706, the first selector 23b selects the address of the address sequencer 21b.

In Step S708, the verify determination circuit 24b determines whether or not the result of a first verify performed on a cell corresponding to the address selected by the first selector 23b is a pass. If the result of determination is found to be the pass (the answer is YES in Step S708), the erase processing proceeds to Step S724. If the result of determination is found to be a fail (the answer is NO in Step S708), the erase processing proceeds to Step S710.

In Step S710, the semiconductor memory device 1b (e.g., embedded program sequencer) adds a number of failed bits to FAILALL of the third register.

In Step S712, the semiconductor memory device 1b (e.g., embedded program sequencer) determines whether or not FAILALL is smaller than n. If FAILALL<n (the answer is YES in Step S712), the erase processing proceeds to Step S714. If FAILALL≥n (the answer is NO in Step S712, the erase processing proceeds to Step S716.

In Step S714, the verify determination circuit 24b determines whether or not the addresses stored in the first register 22b are a predetermined number. This determination processing is similar to the processing shown in FIG. 4, and further description of it will be omitted herein. If the determination result is affirmative (the answer is YES in Step S714), the erase processing proceeds to Step S716. If the determination result is negative (the answer is NO in Step S714), the erase processing proceeds to Step S722.

In Step S716, a predetermined voltage is applied to a cell group targeted for erasure including a memory cell selected by the first selector 23b.

In Step S718, second verify processing is performed on a cell of the address selected by the first selector 23b. This second verify processing will be described in detail using FIG. 11. When the second verify processing is finished, the erase processing proceeds to Step S720.

In Step S720, the semiconductor memory device 1b (e.g., embedded program sequencer) determines whether or not FAILALL is smaller than n. If FAILALL<n (the answer is YES in Step S720), the erase processing proceeds to Step S706. If FAILALL≥n (the answer is NO in Step S720), the erase processing proceeds to Step S716.

Figure 11:
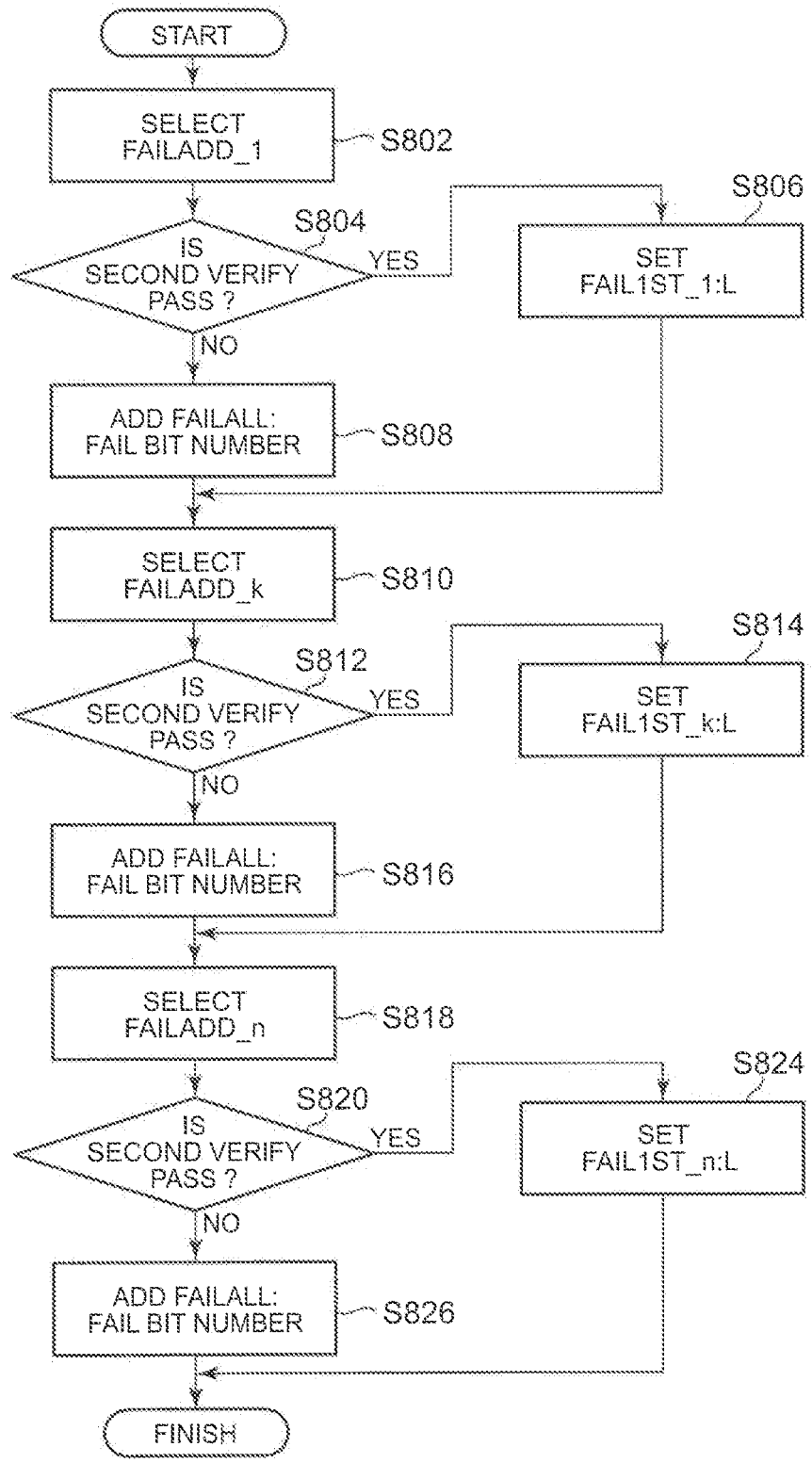
FIG. 11 is a flowchart illustrating example second verify processing in the third embodiment.

FIG. 11 is a flowchart showing example second verify processing in the third embodiment. The processing shown in FIG. 11 corresponds to the processing of Step S718. In Step S802, 0 is set to FAILALL of the third register. The first selector 23b selects the address stored in FAILADD_1.

In Step S804, the verify determination circuit 24b determines whether or not the result of a second verify executed on a cell of the address selected by the first selector 23b is a pass. If the result of determination is found to be the pass (the answer is YES in Step S804), the processing proceeds to Step S806. If the result of determination is found to be a fail (the answer is NO in Step S804), the processing proceeds to Step S808.

In Step S806, the verify determination circuit 24b sets FAIL1ST_1 of the second register 25b to L.

In Step S808, the verify determination circuit 24b adds a number of fail bits to FAILALL.

In Step S810, the first selector 23b selects the address stored in FAILADD_k.

In Step S812, the verify determination circuit 24b determines whether or not the result of the second verify performed on a cell of the address selected by the first selector 23b is a pass. If the result of determination is found to be the pass (the answer is YES in Step S812), the processing proceeds to Step S814. If the result of determination is found to be a fail (the answer is NO in Step S812), the processing proceeds to Step S816. The processing of Steps S810 and S812 is executed in succession with 1 added to k insofar as the result of determination is negative.

In Step S814, the verify determination circuit 24b sets FAIL1ST_k of the second register 25b to L.

In Step S816, the verify determination circuit 24b adds a number of fail bits to FAILALL.

In Step S818, the first selector 23b selects the address stored in FAILADD_n.

In Step S820, the verify determination circuit 24b determines whether or not the result of the second verify executed on a cell of the address selected by the first selector 23b is a pass. If the result of determination is found to be the pass (the answer is YES in Step S820), the processing proceeds to Step S824. If the result of determination is found to be a fail (the answer is NO in Step S820), the processing is finished.

In Step S824, the verify determination circuit 24b sets FAIL1ST_n of the second register 25b to L.

In Step S826, the verify determination circuit 24b adds a number of fail bits to FAILALL. After the processing of Step S824 or Step S826, the processing proceeds to Step S720.

By the above processing in the third embodiment, the test control circuit can be incorporated into the semiconductor memory device provided to the market. If ECC for error-correcting the predetermined number of bits is used with respect to the bits in each failed cell since the number of failed cells is less than or equal to the predetermined number, this embodiment is applicable even in the user mode.

Although features of the test control circuit, the semiconductor memory device, and the method for testing the semiconductor memory device according to the present invention has been described based on the embodiments, these are merely examples and are not limited to the above description.

What is claimed is:

1. A test control circuit comprising:
    an address sequencer that generates a first address for selecting a cell in a predetermined order;
    a register that stores a second address of a cell that is determined to be a fail by a verify determination;
    a selector that selects the first address generated by the address sequencer or the second address stored in the register based on whether or not one or more predetermined number of addresses have been stored in the register; and
    a verify determination circuit that performs a verify determination of a cell which is indicated by the address selected by the selector;
    wherein the verify determination circuit performs a first verify determination of a cell which is indicated by the first address generated by the address sequencer and performs a second verify determination of one or more cells which are indicated by the one or more predetermined number of addresses after a predetermined voltage has been applied to a plurality of cells of an erase unit where there is a cell determined to be a fail in the first verify determination in a state in which the one or more predetermined number of addresses have been stored in a register, and
    wherein the selector selects the first address generated by the address sequencer after the second verify determination has been finished.

2. The test control circuit according to claim 1, further comprising:
    a second register that stores information that indicates whether or not an address is stored in the register,
    wherein the selector selects the first address generated by the address sequencer until it is determined that the one or more predetermined number of addresses have been stored in the register based on the information stored in the second register.

3. The test control circuit according to claim 1, wherein the address sequencer generates a next address in the predetermined order when the first verify determination has resulted in a pass or when the address has been stored in the register.

4. A semiconductor memory device comprising:
    a test control circuit comprising:
        an address sequencer that generates a first address for selecting a cell in a predetermined order;
        a register that stores a second address of a cell that is determined to be a fail by a verify determination;
        a selector that selects the first address generated by the address sequencer or the second address stored in the register based on whether or not one or more predetermined number of addresses have been stored in the register; and
        a verify determination circuit that performs a verify determination of a cell which is indicated by the address selected by the selector;
        wherein the verify determination circuit performs a first verify determination of a cell which is indicated by the first address generated by the address sequencer and performs a second verify determination of one or more cells which are indicated by the one or more predetermined number of addresses after a predetermined voltage has been applied to a plurality of cells of an erase unit where there is a cell determined to be a fail in the first verify determination in a state in which the one or more predetermined number of addresses have been stored in a register, and
        wherein the selector selects the first address generated by the address sequencer after the second verify determination has been finished; and
    a memory cell array including the cell.

5. A method for testing a semiconductor memory device, comprising:
    performing a first verify of a cell selected in a predetermined order;
    storing an address of the cell when the first verify is a fail until the number of addresses is a predetermined number;
    applying a predetermined voltage to a plurality of cells of an erase unit when a next fail is determined in the first verify after the predetermined number of addresses have been stored; and
    performing a second verify to one or more cells indicated by the predetermined number of addresses,
    wherein the first verify is performed from a cell at the next fail according to the predetermined order after the second verify has finished.

* * * * *